(12) United States Patent
Khlat (10) Patent No.: US 11,057,012 B2
(45) Date of Patent: Jul. 6, 2021

(54) DISTRIBUTED ENVELOPE TRACKING AMPLIFIER CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/267,740

(22) Filed: Feb. 5, 2019

(65) Prior Publication Data

US 2020/0127611 A1    Apr. 23, 2020

Related U.S. Application Data

(60) Provisional application No. 62/748,077, filed on Oct. 19, 2018.

(51) Int. Cl.
  *H03G 3/20* (2006.01)
  *H03F 3/68* (2006.01)
  (Continued)

(52) U.S. Cl.
  CPC ............ *H03F 3/68* (2013.01); *H03F 1/02* (2013.01); *H03F 1/0233* (2013.01); *H03F 1/08* (2013.01);
  (Continued)

(58) Field of Classification Search
  CPC . H03F 3/68; H03F 3/19; H03F 1/0233; H03F 1/02; H03F 3/211; H03F 1/08;
  (Continued)

(56) References Cited

U.S. PATENT DOCUMENTS 6,529,716 B1    3/2003    Eidson et al.
6,788,151 B2 *  9/2004    Shvarts ............... H03F 1/025
                                                              330/127

(Continued)

OTHER PUBLICATIONS

Non-Final Office Action for U.S. Appl. No. 16/263,368, dated Dec. 26, 2019, 6 pages.

(Continued)

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A distributed envelope tracking (ET) amplifier circuit and related apparatus are provided. The distributed ET amplifier apparatus includes an amplifier circuit configured to amplify a radio frequency (RF) signal based on a modulated voltage. In examples discussed herein, the amplifier circuit is co-located with an ET voltage circuit configured to supply the modulated voltage such that a trace inductance between the amplifier circuit and the ET voltage circuit can be reduced to below a defined threshold. By co-locating the amplifier circuit with the ET voltage circuit to reduce a coupling distance between the amplifier circuit and the ET voltage circuit and thus the trace inductance associated with the coupling distance, it may be possible to reduce degradation in the modulated voltage. As a result, it may be possible to improve efficiency and maintain linearity in the amplifier circuit, particularly when the RF signal is modulated at a higher modulation bandwidth.

19 Claims, 6 Drawing Sheets

(51) Int. Cl.
*H03F 3/45* (2006.01)
*H03F 1/08* (2006.01)
*H03F 3/21* (2006.01)
*H03F 1/02* (2006.01)
*H03F 3/19* (2006.01)
*H03F 3/04* (2006.01)

(52) U.S. Cl.
CPC .............. *H03F 3/19* (2013.01); *H03F 3/211* (2013.01); *H03F 3/45071* (2013.01); *H03F 3/04* (2013.01); *H03F 2200/102* (2013.01); *H03F 2200/129* (2013.01); *H03F 2200/375* (2013.01); *H03F 2200/451* (2013.01); *H03F 2203/21106* (2013.01)

(58) Field of Classification Search
CPC ........... H03F 3/45071; H03F 2200/129; H03F 2200/375; H03F 2200/451; H03F 2200/102; H03F 2203/21106
USPC ................ 330/291, 127, 297, 136; 375/287; 455/127.1
See application file for complete search history.

(56) References Cited

U.S. PATENT DOCUMENTS

| | | | |
|---|---|---|---|
| 8,019,289 B2 | 9/2011 | Gorbachov | |
| 8,290,453 B2 | 10/2012 | Yoshihara | |
| 8,385,859 B2 | 2/2013 | Hamano | |
| 8,476,976 B2 | 7/2013 | Wimpenny | |
| 8,598,950 B2 | 12/2013 | Khesbak | |
| 8,600,321 B2 | 12/2013 | Nambu et al. | |
| 8,611,402 B2 | 12/2013 | Chiron | |
| 8,665,016 B2 | 3/2014 | Chowdhury et al. | |
| 8,665,931 B2 | 3/2014 | Afsahi et al. | |
| 8,803,603 B2 | 8/2014 | Wimpenny | |
| 8,816,272 B1 | 8/2014 | Brown et al. | |
| 8,816,768 B2 | 8/2014 | Tseng et al. | |
| 8,818,305 B1 | 8/2014 | Schwent et al. | |
| 8,921,774 B1 | 12/2014 | Brown et al. | |
| 8,942,651 B2 | 1/2015 | Jones | |
| 8,989,682 B2 | 3/2015 | Ripley et al. | |
| 9,002,303 B2 | 4/2015 | Brobston | |
| 9,065,509 B1 | 6/2015 | Yan et al. | |
| 9,197,162 B2 | 11/2015 | Chiron et al. | |
| 9,197,256 B2 | 11/2015 | Khlat | |
| 9,246,460 B2 | 1/2016 | Khlat et al. | |
| 9,247,496 B2 | 1/2016 | Khlat | |
| 9,270,230 B2 | 2/2016 | Henshaw et al. | |
| 9,287,829 B2 | 3/2016 | Nobbe et al. | |
| 9,288,098 B2 | 3/2016 | Yan et al. | |
| 9,294,043 B2 | 3/2016 | Ripley et al. | |
| 9,374,005 B2 | 6/2016 | Rozek et al. | |
| 9,379,667 B2 | 6/2016 | Khlat et al. | |
| 9,438,172 B2 | 9/2016 | Cohen | |
| 9,515,621 B2 | 12/2016 | Hietala et al. | |
| 9,515,622 B2 | 12/2016 | Nentwig et al. | |
| 9,516,693 B2 | 12/2016 | Khlat et al. | |
| 9,571,152 B2 | 2/2017 | Ripley et al. | |
| 9,596,110 B2 | 3/2017 | Jiang et al. | |
| 9,614,476 B2 | 4/2017 | Khlat | |
| 9,614,477 B1 | 4/2017 | Rozenblit et al. | |
| 9,641,206 B2 | 5/2017 | Pratt et al. | |
| 9,671,801 B2 | 6/2017 | Bhattad et al. | |
| 9,743,357 B2 | 8/2017 | Tabe | |
| 9,831,834 B2 | 11/2017 | Balteanu et al. | |
| 9,831,934 B2 | 11/2017 | Kotecha et al. | |
| 9,843,294 B2 | 12/2017 | Khlat | |
| 9,859,845 B2 | 1/2018 | Sarbishaei et al. | |
| 9,912,296 B1 | 3/2018 | Cheng et al. | |
| 9,912,297 B2 | 3/2018 | Khlat | |
| 9,912,301 B2 | 3/2018 | Xue et al. | |
| 9,941,844 B2 | 4/2018 | Khlat | |
| 9,948,240 B2 | 4/2018 | Khlat et al. | |
| 9,954,436 B2 | 4/2018 | Khlat | |
| 9,960,737 B1 | 5/2018 | Kovac | |
| 9,974,050 B2 | 5/2018 | Wiser et al. | |
| 9,991,851 B1 | 6/2018 | Dinur et al. | |
| 9,991,856 B2 | 6/2018 | Khesbak et al. | |
| 9,991,913 B1 | 6/2018 | Dinur et al. | |
| 10,003,303 B2 | 6/2018 | Afsahi et al. | |
| 10,069,470 B2 | 9/2018 | Khlat et al. | |
| 10,090,809 B1 | 10/2018 | Khlat | |
| 10,097,387 B1 | 10/2018 | Wiser et al. | |
| 10,103,926 B1 | 10/2018 | Khlat | |
| 10,110,169 B2 | 10/2018 | Khesbak et al. | |
| 10,141,891 B2 | 11/2018 | Gomez et al. | |
| 10,158,330 B1 | 12/2018 | Khlat | |
| 10,171,037 B2 | 1/2019 | Khlat | |
| 10,171,038 B1 | 1/2019 | Chen et al. | |
| 10,181,826 B2 | 1/2019 | Khlat et al. | |
| 10,204,775 B2 | 2/2019 | Brown et al. | |
| 10,305,429 B2 | 5/2019 | Choo et al. | |
| 10,326,408 B2 | 6/2019 | Khlat et al. | |
| 10,355,646 B2 | 7/2019 | Lee et al. | |
| 10,361,660 B2 | 7/2019 | Khlat | |
| 10,382,147 B2 | 8/2019 | Ripley et al. | |
| 10,396,716 B2 | 8/2019 | Afsahi et al. | |
| 10,419,255 B2 | 9/2019 | Wiser et al. | |
| 10,432,145 B2 | 10/2019 | Khlat | |
| 10,439,557 B2 | 10/2019 | Khlat et al. | |
| 10,439,789 B2 | 10/2019 | Brunel et al. | |
| 10,454,428 B2 | 10/2019 | Khesbak et al. | |
| 10,476,437 B2 | 11/2019 | Nag et al. | |
| 2004/0100323 A1 | 5/2004 | Khanifer et al. | |
| 2009/0128236 A1 | 5/2009 | Wilson | |
| 2009/0253389 A1 | 10/2009 | Ma et al. | |
| 2011/0223875 A1 | 9/2011 | Hamano | |
| 2012/0142304 A1 | 6/2012 | Degani et al. | |
| 2012/0146731 A1* | 6/2012 | Khesbak | H03F 1/0277 330/295 |
| 2012/0194274 A1 | 8/2012 | Fowers et al. | |
| 2012/0302179 A1 | 11/2012 | Brobston | |
| 2012/0309333 A1 | 12/2012 | Nambu et al. | |
| 2013/0141159 A1 | 6/2013 | Strange et al. | |
| 2013/0207731 A1 | 8/2013 | Balteanu | |
| 2013/0285750 A1 | 10/2013 | Chowdhury et al. | |
| 2014/0111279 A1 | 4/2014 | Brobston | |
| 2014/0218109 A1 | 8/2014 | Wimpenny | |
| 2014/0306763 A1 | 10/2014 | Hong et al. | |
| 2014/0306769 A1 | 10/2014 | Khlat et al. | |
| 2014/0361837 A1 | 12/2014 | Strange et al. | |
| 2015/0009980 A1 | 1/2015 | Modi et al. | |
| 2015/0091645 A1 | 4/2015 | Park et al. | |
| 2015/0123628 A1 | 5/2015 | Bhattad et al. | |
| 2015/0194988 A1 | 7/2015 | Yan et al. | |
| 2015/0236729 A1 | 8/2015 | Peng et al. | |
| 2016/0036389 A1 | 2/2016 | Balteanu et al. | |
| 2016/0050629 A1 | 2/2016 | Khesbak et al. | |
| 2016/0094185 A1 | 3/2016 | Shute | |
| 2016/0094186 A1 | 3/2016 | Cohen | |
| 2016/0105151 A1 | 4/2016 | Langer | |
| 2016/0181995 A1 | 6/2016 | Nentwig et al. | |
| 2016/0204809 A1 | 7/2016 | Pratt et al. | |
| 2016/0226448 A1 | 8/2016 | Wimpenny | |
| 2016/0294587 A1 | 10/2016 | Jiang et al. | |
| 2017/0070199 A1 | 3/2017 | Anderson et al. | |
| 2017/0077877 A1 | 3/2017 | Anderson | |
| 2017/0093340 A1 | 3/2017 | Khesbak | |
| 2017/0207802 A1 | 7/2017 | Pratt et al. | |
| 2017/0230924 A1 | 8/2017 | Wolberg et al. | |
| 2017/0279412 A1 | 9/2017 | Afsahi et al. | |
| 2017/0353287 A1 | 12/2017 | Onaka et al. | |
| 2018/0048276 A1 | 2/2018 | Khlat et al. | |
| 2018/0138862 A1 | 5/2018 | Balteanu et al. | |
| 2018/0138863 A1 | 5/2018 | Khlat | |
| 2018/0159476 A1 | 6/2018 | Balteanu et al. | |
| 2018/0159566 A1 | 6/2018 | Dinur et al. | |
| 2018/0287564 A1 | 10/2018 | Afsahi et al. | |
| 2018/0309409 A1 | 10/2018 | Khlat | |
| 2018/0309414 A1 | 10/2018 | Khlat et al. | |
| 2018/0316440 A1 | 11/2018 | Mita | |
| 2018/0358930 A1 | 12/2018 | Haine | |

(56) References Cited

U.S. PATENT DOCUMENTS

| | | |
|---|---|---|
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |
| 2020/0350878 A1 | 11/2020 | Drogi et al. |

OTHER PUBLICATIONS

Notice of Allowance for U.S. Appl. No. 16/273,288, dated Dec. 13, 2019, 8 pages.

Non-Final Office Action for U.S. Appl. No. 16/263,316, dated Dec. 23, 2019, 9 pages.

Notice of Allowance for U.S. Appl. No. 16/193,513, dated Mar. 25, 2020, 8 pages.

Non-Final Office Action for U.S. Appl. No. 16/250,229, dated Apr. 29, 2020, 7 pages.

Final Office Action for U.S. Appl. No. 16/263,316, dated May 13, 2020, 10 pages.

Notice of Allowance for U.S. Appl. No. 16/270,119, dated Jun. 18, 2020, 9 pages.

Non-Final Office Action for U.S. Appl. No. 16/278,886, dated Apr. 29, 2020, 9 pages.

Quayle Action for U.S. Appl. No. 16/267,779, mailed May 1, 2020, 8 pages.

Final Office Action for U.S. Appl. No. 16/263,368, dated May 22, 2020, 9 pages.

Non-Final Office Action for U.S. Appl. No. 16/263,316, dated Nov. 24, 2020, 4 pages.

Non-Final Office Action for U.S. Appl. No. 16/263,368, dated Dec. 17, 2020, 8 pages.

Notice of Allowance for U.S. Appl. No. 16/508,704, dated Dec. 30, 2020, 7 pages.

Notice of Allowance for U.S. Appl. No. 16/508,768, dated Oct. 27, 2020, 9 pages.

Quayle Action for U.S. Appl. No. 16/514,339, mailed Nov. 19, 2020, 9 pages.

Notice of Allowance for U.S. Appl. No. 16/250,229, dated Sep. 22, 2020, 7 pages.

Non-Final Office Action for U.S. Appl. No. 16/263,316, dated Jul. 17, 2020, 4 pages.

Notice of Allowance for U.S. Appl. No. 16/278,886, dated Sep. 22, 2020, 8 pages.

Non-Final Office Action for U.S. Appl. No. 16/250,298, dated Aug. 20, 2020, 8 pages.

Non-Final Office Action for U.S. Appl. No. 16/263,368, dated Aug. 7, 2020, 4 pages.

Notice of Allowance for U.S. Appl. No. 16/267,740, dated Mar. 30, 2021, 7 pages.

Quayle Action for U.S. Appl. No. 16/250,298, dated Feb. 3, 2021, 5 pages.

Notice of Allowance for U.S. Appl. No. 16/250,298, dated Apr. 15, 2021, 8 pages.

Non-Final Office Action for U.S. Appl. No. 16/689,236, dated Mar. 2, 2021, 15 pages.

Notice of Allowance for U.S. Appl. No. 16/263,368, dated Apr. 29, 2021, 7 pages.

Non-Final Office Action for U.S. Appl. No. 16/660,900, dated Feb. 18, 2021, 7 pages.

Notice of Allowance for U.S. Appl. No. 16/689,417, dated Feb. 24, 2021, 7 pages.

\* cited by examiner

DISTRIBUTED ENVELOPE TRACKING AMPLIFIER CIRCUIT AND RELATED APPARATUS

RELATED APPLICATION

This application claims the benefit of U.S. provisional patent application No. 62/748,077, filed on Oct. 19, 2018, the disclosure of which is incorporated herein by reference in its entirety.

This application is related to concurrently filed U.S. patent application Ser. No. 16/267,779, filed Feb. 5, 2019, entitled "DISTRIBUTED ENVELOPE TRACKING AMPLIFIER CIRCUIT AND RELATED APPARATUS," now U.S. Pat. No. 10,931,248, the disclosure of which is hereby incorporated herein by reference in its entirety.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Notably, the better the time-variant voltage envelope tracks the time-variant power envelope, the higher efficiency can be achieved in the ET power amplifier(s). In this regard, it may be necessary for the ET system to constantly adjust the time-variant voltages applied to the ET power amplifier(s) to ensure that the ET power amplifier(s) can consistently operate at a desired efficiency for any given instantaneous power requirement of the RF signal(s).

SUMMARY

Aspects disclosed in the detailed description include a distributed envelope tracking (ET) amplifier circuit and related apparatus. The distributed ET amplifier apparatus includes an amplifier circuit configured to amplify a radio frequency (RF) signal based on a modulated voltage (e.g., ET voltage). In examples discussed herein, the amplifier circuit is co-located with an ET voltage circuit configured to supply the modulated voltage such that a trace inductance between the amplifier circuit and the ET voltage circuit can be reduced to below a defined threshold. By co-locating the amplifier circuit with the ET voltage circuit to reduce a coupling distance between the amplifier circuit and the ET voltage circuit and thus the trace inductance associated with the coupling distance, it may be possible to reduce degradation in the modulated voltage. As a result, it may be possible to improve efficiency and maintain linearity in the amplifier circuit, particularly when the RF signal is modulated at a higher modulation bandwidth (e.g., >80 MHz).

In one aspect, a distributed ET amplifier circuit is provided. The distributed ET amplifier circuit includes interface circuitry configured to receive an ET target voltage and one or more supply voltages. The distributed ET amplifier circuit also includes an ET voltage circuit coupled to the interface circuitry. The ET voltage circuit is configured to generate a modulated voltage based on the ET target voltage and a selected supply voltage among the one or more supply voltages. The distributed ET amplifier circuit also includes an amplifier circuit configured to amplify an RF signal based on the modulated voltage.

In another aspect, an ET amplifier apparatus is provided. The ET amplifier apparatus includes a distributed ET amplifier circuit. The distributed ET amplifier circuit includes interface circuitry configured to receive an ET target voltage and one or more supply voltages. The distributed ET amplifier circuit also includes an ET voltage circuit coupled to the interface circuitry. The ET voltage circuit is configured to generate a modulated voltage based on the ET target voltage and a selected supply voltage among the one or more supply voltages. The distributed ET amplifier circuit also includes an amplifier circuit configured to amplify an RF signal based on the modulated voltage. The ET amplifier apparatus also includes an ET tracker circuit. The ET tracker circuit includes a first interface coupled to the distributed ET amplifier circuit. The ET tracker circuit is configured to provide the ET target voltage and the one or more supply voltages to the distributed ET amplifier circuit.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a distributed envelope tracking (ET) amplifier circuit and related apparatus. The distributed ET amplifier apparatus includes an amplifier circuit configured to amplify a radio frequency (RF) signal based on a modulated voltage (e.g., ET voltage). In examples discussed herein, the amplifier circuit is co-located with an ET voltage circuit configured to supply the modulated voltage such that a trace inductance between the amplifier circuit and the ET voltage circuit can be reduced to below a defined threshold. By co-locating the amplifier circuit with the ET voltage circuit to reduce a coupling distance between the amplifier circuit and the ET voltage circuit and thus the trace inductance associated with the coupling distance, it may be possible to reduce degradation in the modulated voltage. As a result, it may be possible to improve efficiency and maintain linearity in the amplifier circuit, particularly when the RF signal is modulated at a higher modulation bandwidth (e.g., >80 MHz).

Figure 1:
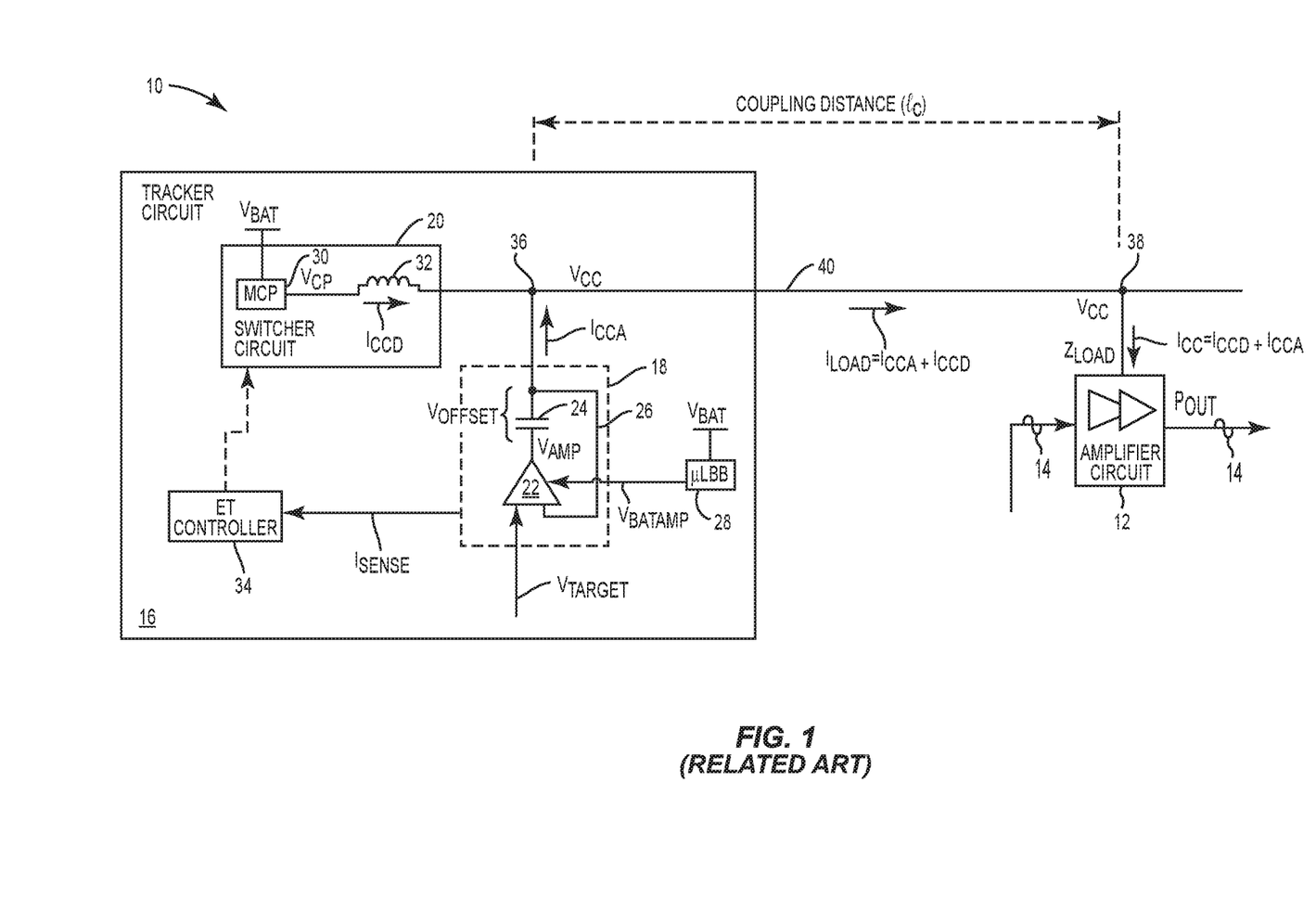
FIG. 1 is a schematic diagram of an exemplary existing envelope tracking (ET) amplifier apparatus in which an amplifier circuit can suffer degraded efficiency and linearity due to trace inductance associated with a long coupling distance.

Before discussing the distributed ET amplifier circuit and an ET amplifier apparatus incorporating the distributed ET amplifier circuit of the present disclosure, a brief overview of an existing ET amplifier apparatus is first provided with reference to FIG. 1 to help understand how a trace inductance can be caused to negatively impact operating efficiency of an amplifier circuit in the existing ET amplifier apparatus. The discussion of specific exemplary aspects of a distributed ET amplifier circuit starts below with reference to FIG. 2.

In this regard, FIG. 1 is a schematic diagram of an exemplary existing ET amplifier apparatus 10 in which an amplifier circuit 12 can suffer degraded efficiency and linearity due to trace inductance associated with a long coupling distance $l_C$. The amplifier circuit 12 is configured to amplify an RF signal 14 based on a modulated voltage (e.g., ET voltage) $V_{CC}$. Dependent on a specific application, the RF signal 14 may be modulated below a defined modulation bandwidth (e.g., 80 MHz) or above the defined modulation bandwidth (e.g., >80 MHz). The RF signal 14 may correspond to a higher peak-to-average ratio (PAR), particularly when the RF signal 14 is modulated above the defined modulation bandwidth. In this regard, the RF signal 14 may be associated with time-variant amplitudes that define a time-variant power envelope.

The existing ET amplifier apparatus 10 includes a tracker circuit 16 that includes at least one voltage amplifier circuit 18 and at least one switcher circuit 20. The voltage amplifier circuit 18 includes a voltage amplifier 22 configured to generate an amplifier voltage $V_{AMP}$ based on a modulated target voltage $V_{TARGET}$ and a supply voltage $V_{BATAMP}$. The modulated target voltage $V_{TARGET}$ may correspond to a time-variant target voltage envelope that tracks the time-variant power envelope of the RF signal 14. Accordingly, the voltage amplifier 22 generates the amplifier voltage $V_{AMP}$ having a time-variant voltage envelope that rises and falls in accordance to the time-variant target voltage envelope.

The voltage amplifier circuit 18 may include an offset capacitor 24 coupled to the voltage amplifier 22. The offset capacitor 24 may be configured to raise the amplifier voltage $V_{AMP}$ by a defined offset voltage $V_{OFFSET}$ (e.g., 0.8 V) to generate the modulated voltage $V_{CC}$ ($V_{CC}=V_{AMP}+V_{OFFSET}$). In this regard, the modulated voltage $V_{CC}$ corresponds to the time-variant voltage envelope that tracks the time-variant target voltage envelope and, therefore, the time-variant power envelope of the RF signal 14.

The amplifier circuit 12 may have an inherent load impedance $Z_{LOAD}$ that can cause a load current $I_{LOAD}$ based on the modulated voltage $V_{CC}$. In this regard, the amplifier circuit 12 may act like a current source/sink to the tracker circuit 16. Given that the modulated voltage $V_{CC}$ rises and falls in accordance to the time-variant power envelope of the RF signal 14, the load current $I_{LOAD}$ may likewise rise or fall based on the time-variant power amplitude of the RF signal 14. Accordingly, the amplifier circuit 12 may output the RF signal 14 at a desired output power $P_{OUT}$ that is positively related to the load current $I_{LOAD}$ and the load impedance $Z_{LOAD}$.

The voltage amplifier circuit 18 may include a feedback loop 26 configured to provide a sample of the modulated voltage $V_{CC}$ back to the voltage amplifier 22. In this regard, the voltage amplifier 22 may be referred to as a closed-loop voltage amplifier. The tracker circuit 16 may include a micro inductor-based buck-boost (µLBB) circuit 28 configured to generate the supply voltage $V_{BATAMP}$ based on a battery voltage $V_{BAT}$. As the name suggests, the µLBB circuit 28 may operate in a buck mode to output the supply voltage $V_{BATAMP}$ at the battery voltage $V_{BAT}$ or in a boost mode to output the supply voltage $V_{BATAMP}$ at two-times the battery voltage $V_{BAT}$ ($2 \times V_{BAT}$).

The switcher circuit 20 includes a multi-level charge pump (MCP) 30 configured to generate a multi-level voltage $V_{CP}$ based on the battery voltage $V_{BAT}$. The MCP 30 may be configured to generate the multi-level voltage $V_{CP}$ at 0 V, $V_{BAT}$, or $2 \times V_{BAT}$. The switcher circuit 20 may include a current inductor 32 coupled in series to the MCP 30. The current inductor 32 may be configured to induce a low-frequency current $I_{CCD}$ based on the multi-level voltage $V_{CP}$. The current inductor 32 may inherently have a relatively large inductance. Accordingly, the current inductor 32 may generate the low-frequency current $I_{CCD}$ closer to a direct current (DC).

When the RF signal 14 is modulated at below the defined modulation bandwidth, the load current $I_{LOAD}$ may be constituted entirely by the low-frequency current $I_{CCD}$. However, when the RF signal 14 is modulated well above the defined modulation bandwidth (e.g., 200 MHz), the low-frequency current $I_{CCD}$ may not be sufficient for the amplifier circuit 12 to amplify the RF signal 14 to the desired output power $P_{OUT}$, particularly when the time-variant power envelope of the RF signal 14 swings rapidly between peak and bottom power levels. As a result, the voltage amplifier 22 may be forced to source an alternate current $I_{CCA}$ to make up the deficit of the low-frequency current $I_{CCD}$. In contrast, when the RF signal 14 remains at a relatively stable power level, the low-frequency current $I_{CCD}$ may be sufficient for the amplifier circuit 12 to amplify the RF signal 14 to the desired output power $P_{OUT}$. As such, the voltage amplifier 22 may be forced to act as a current sink to absorb excessive alternate current.

In this regard, the voltage amplifier circuit 18 may be configured to generate a sense current $I_{SENSE}$ indicative of the alternate current $I_{CCA}$ sourced or sunk by the voltage amplifier 22. The tracker circuit 16 may include an ET controller 34, which can be a bang-bang controller (BBC) for example. The ET controller 34 may receive the sense current $I_{SENSE}$ from the voltage amplifier circuit 18. Accordingly, the ET controller 34 may control the switcher circuit 20 to adjust (increase or decrease) the low-frequency current $I_m$p.

The voltage amplifier circuit 18 may be configured to generate the modulated voltage $V_{CC}$ at a first coupling node 36. The amplifier circuit 12, on the other hand, may be coupled to a second coupling node 38 to receive the modulated voltage $V_{CC}$. The first coupling node 36 may be coupled to the second coupling node 38 via a conductive trace 40 over the coupling distance $l_C$.

As the load current $I_{LOAD}$ flows from the first coupling node 36 toward the second coupling node 38, the conductive trace 40 can induce a trace inductance $L_T$ (also known as self-inductance) that is positively related to the coupling distance $l_C$. The trace inductance $L_T$ may cause a trace voltage $V_L$ across the conductive trace, as can be estimated based on the equation (Eq. 1) below.

$$V_L = -L_T \frac{\Delta I_{LOAD}}{\Delta t} \quad (Eq.\ 1)$$

In the equation above, $L_T$ represents the trace inductance of the conductive trace 40 and $\Delta I_{LOAD}/\Delta t$ represents a time-variant change of the load current $I_{LOAD}$. Notably, the trace voltage $V_L$ can cause the modulated voltage $V_{CC}$ to fluctuate at the second coupling node 38. As such, the modulated voltage $V_{CC}$ may be out of alignment with the time-variant power envelope of the RF signal 14, thus causing the amplifier circuit 12 to suffer degraded efficiency and linearity. Moreover, the $\Delta_{LOAD}/\Delta t$ can increase to result in a larger trace voltage $V_L$ when the RF signal is modulated at a higher modulation bandwidth. As such, it may be desired to reduce the trace inductance $L_T$ between the voltage amplifier circuit 18 and the amplifier circuit 12 to achieve a desired efficiency and linearity in the amplifier circuit 12.

Figure 2:
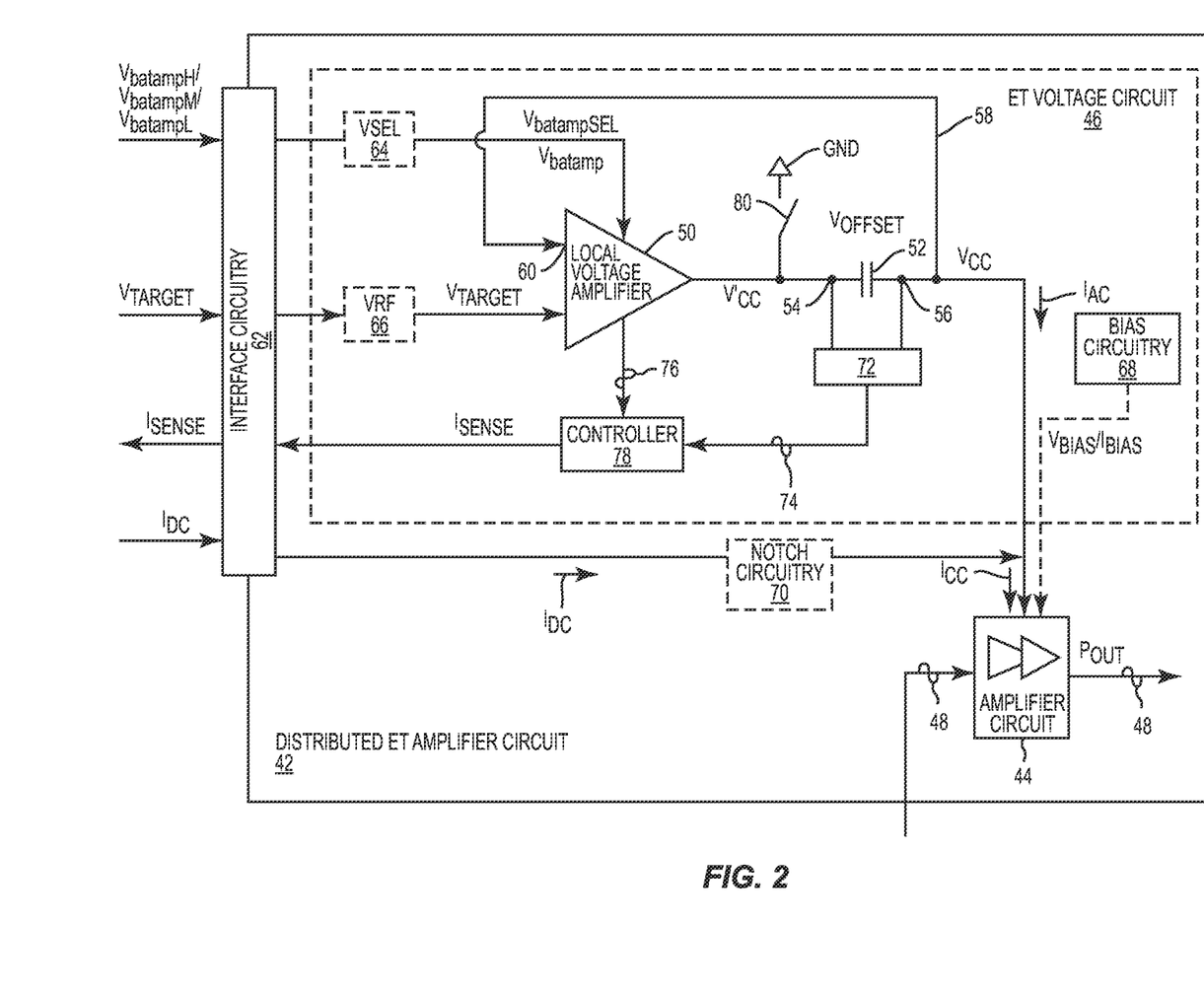
FIG. 2 is a schematic diagram of an exemplary distributed ET amplifier circuit configured according to an embodiment of the present disclosure to reduce the trace inductance in the existing ET amplifier apparatus of FIG. 1 by co-locating an amplifier circuit with an ET voltage circuit in the distributed ET amplifier circuit.

In this regard, FIG. 2 is a schematic diagram of an exemplary distributed ET amplifier circuit 42 configured according to an embodiment of the present disclosure to reduce the trace inductance $L_T$ in the existing ET amplifier apparatus 10 of FIG. 1 by co-locating an amplifier circuit 44 with an ET voltage circuit 46 in the distributed ET amplifier circuit 42. In a non-limiting example, the amplifier circuit 44 and the ET voltage circuit 46 can be provided in separate semiconductor dies. Herein, the amplifier circuit 44 and the ET voltage circuit 46 are said to be co-located when the amplifier circuit 44 is separated from the ET voltage circuit 46 by a conductive length having a trace inductance less than 0.4 nanoHenry (nH). By co-locating the amplifier circuit 44 with the ET voltage circuit 46, it may be possible to improve efficiency and linearity of the amplifier circuit 44, regardless of whether the RF signal 48 is modulated above or below the defined modulation bandwidth.

The amplifier circuit 44 is configured to amplify an RF signal 48 based on a modulated voltage $V_{CC}$. The ET voltage circuit 46 is configured to generate the modulated voltage $V_{CC}$ and provide the modulated voltage $V_{CC}$ to the amplifier circuit 44 over the reduced coupling distance. The ET voltage circuit 46 includes a local voltage amplifier 50 that is coupled to the amplifier circuit 44 via an offset capacitor 52. In this regard, the offset capacitor 52 has a first end 54 coupled to the local voltage amplifier 50 and a second end 56 coupled to the amplifier circuit 44. The local voltage amplifier 50 is configured to generate an initial modulated voltage $V'_{CC}$ based on an ET target voltage $V_{TARGET}$ and a supply voltage $V_{batamp}$. The offset capacitor 52 is configured to raise the initial modulated voltage $V'_{CC}$ by a predetermined offset voltage $V_{OFFSET}$ (e.g., 0.8 V) to generate the modulated voltage $V_{CC}$ ($V_{CC}=V'_{CC}+V_{OFFSET}$). The ET voltage circuit 46 may include a feedback loop 58 coupled from the second end 56 to a feedback end 60 of the local voltage amplifier 50. The feedback loop 58 is configured to provide a sample of the modulated voltage $V_{CC}$ back to the local voltage amplifier 50.

The distributed ET amplifier circuit 42 may include interface circuitry 62, which can be an RF front-end (RFFE) interface for example, configured to receive the ET target voltage $V_{TARGET}$ and one or more supply voltages $V_{batampH}$ (referred to as "high supply voltage"), $V_{batampM}$ (referred to as "medium supply voltage"), and $V_{batampL}$ (referred to as "low supply voltage") ($V_{batampH}>V_{batampM}>V_{batampL}$). The ET voltage circuit 46 may include a voltage selector 64 (denoted as "VSEL") configured to determine a selected supply voltage $V_{batampSEL}$ among the supply voltages $V_{batampH}$, $V_{batampM}$, and $V_{batampL}$ and provide the selected supply voltage $V_{batampSEL}$ to the local voltage amplifier 50 as the supply voltage $V_{batamp}$. In a non-limiting example, the selected supply voltage $V_{batampSEL}$ can be based on an average, such as root mean square (RMS), of the modulate voltage $V_{CC}$ or an average power of the RF signal 48. By determining and providing the selected supply voltage $V_{batampSEL}$ to the local voltage amplifier 50, it may be possible to improve efficiency and linearity of the local voltage amplifier 50.

The ET voltage circuit 46 may include a target voltage processing circuit 66 (denoted as "VRF") coupled between the interface circuitry 62 and the local voltage amplifier 50. The target voltage processing circuit 66 may be configured to pre-process the ET target voltage $V_{TARGET}$ based on a defined transfer function H(s). In a non-limiting example, the target voltage processing circuit 66 can be configured to adapt the defined transfer function H(s) in accordance to the coupling distance, and the corresponding trace inductance, between the local voltage amplifier 50 and the amplifier circuit 44.

The ET voltage circuit 46 may include bias circuitry 68 coupled to the amplifier circuit 44. In a non-limiting example, the amplifier circuit 44 can be a two-stage amplifier circuit. In this regard, the bias circuitry 68 may be configured to provide a bias voltage $V_{BIAS}$ and/or a bias current $I_{BIAS}$ to the two-stage amplifier circuit.

In addition to the modulated voltage $V_{CC}$, the amplifier circuit 44 further requires a current $I_{CC}$ for amplifying the RF signal 48. The interface circuitry 62 may be further configured to receive a direct current $I_{DC}$. The local voltage amplifier 50 may be configured to source or sink an alternating current $I_{AC}$. As such, the current $I_{CC}$ may be a combination of the direct current $I_{DC}$ and the alternating current $I_{AC}$ ($I_{CC}=I_{DC}+I_{AC}$). Notably, the direct current $I_{DC}$ may be generated from another circuit coupled to the interface circuitry 62 over a longer conductive trace. In this regard, the ET voltage circuit 46 may include notch circuitry 70. The notch circuitry 70 may be coupled between the interface circuitry 62 and the amplifier circuit 44 and configured to improve impedance matching with respect to the circuit that generates the direct current $I_{DC}$.

The ET voltage circuit 46 may be configured to output a sense current $I_{SENSE}$ via the interface circuitry 62. The sense current $I_{SENSE}$ may be generated to indicate the alternating current $I_{AC}$ that is sourced or sank by the local voltage amplifier 50. In a non-limiting example, the ET voltage circuit 46 includes circuitry 72 coupled in parallel to the offset capacitor 52 between the first end 54 and the second end 56. The circuitry 72 may be configured to generate a voltage indicator 74 indicative of voltage differential between the initial modulated voltage $V'_{CC}$ and the modulated voltage $V_{CC}$. The local voltage amplifier 50 may be configured to generate a current indicator 76 indicative of the alternating current $I_{AC}$ sourced or sank by the local voltage amplifier 50. Accordingly, a controller 78 may be configured to generate the sense current $I_{SENSE}$ based on the voltage indicator 74 and the current indicator 76.

In a non-limiting example, the modulated voltage $V_{CC}$ can be an ET modulated voltage. In another non-limiting example, the modulated voltage $V_{CC}$ can also be an average power tracking (APT) modulated voltage. In this regard, the ET voltage circuit 46 may be configured to include a switch 80 coupled between the first end 54 and a ground GND. When the modulated voltage $V_{CC}$ is generated as the APT modulated voltage, the switch 80 may be closed to bypass the offset capacitor 52.

Figure 3:
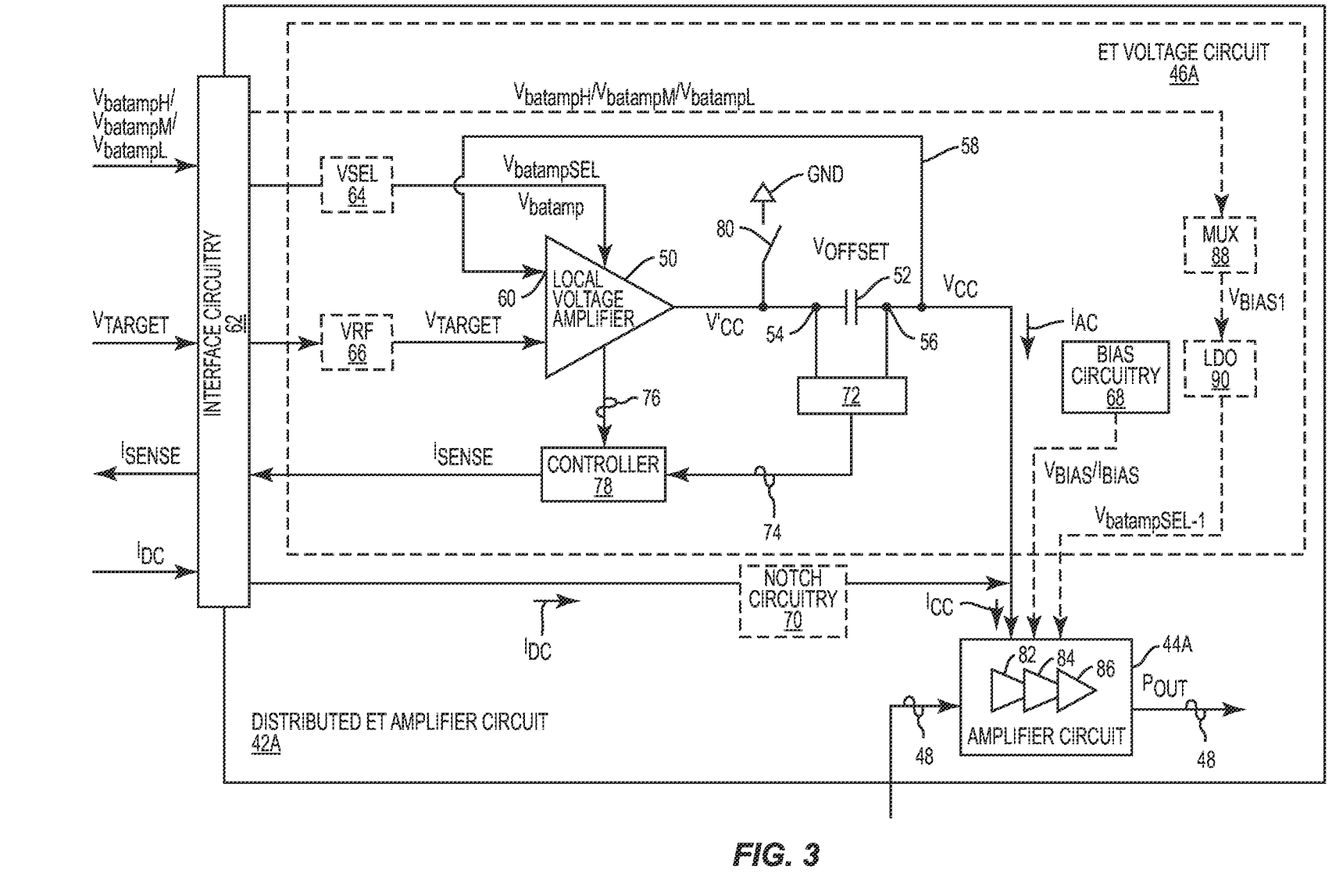
FIG. 3 is a schematic diagram of an exemplary distributed ET amplifier circuit configured according to another embodiment of the present disclosure.

FIG. 3 is a schematic diagram of an exemplary distributed ET amplifier circuit 42A configured according to another embodiment of the present disclosure. Common elements between FIGS. 2 and 3 are shown therein with common element numbers and will not be re-described herein.

The distributed ET amplifier circuit 42A includes an amplifier circuit 44A and an ET voltage circuit 46A. In a non-limiting example, the amplifier circuit 44A is a three-stage amplifier circuit including a first stage amplifier 82, a second stage amplifier 84, and a third stage amplifier 86. In this regard, the ET voltage circuit 46A may include a bias voltage selector 88 (denoted as "MUX") coupled to the interface circuitry 62 to receive the supply voltages $V_{batampH}$, $V_{batampM}$, and $V_{batampL}$. The bias voltage selector 88 may be configured to determine a selected bias voltage $V_{BIAS1}$ among the supply voltages $V_{batampH}$, $V_{batampM}$, and $V_{batampL}$. The ET voltage circuit 46A may also include a low drop out (LDO) regulator 90. The LDO regulator 90 receives the selected voltage $V_{BIAS1}$ from the bias voltage selector 88 and provides the selected voltage $V_{BIAS1}$ to the first stage amplifier 82. The bias circuitry 68, on the other hand, may be configured to provide the bias voltage $V_{BIAS}$ and/or the bias current $I_{BIAS}$ to the second stage amplifier 84 and the third stage amplifier 86.

Figure 4:
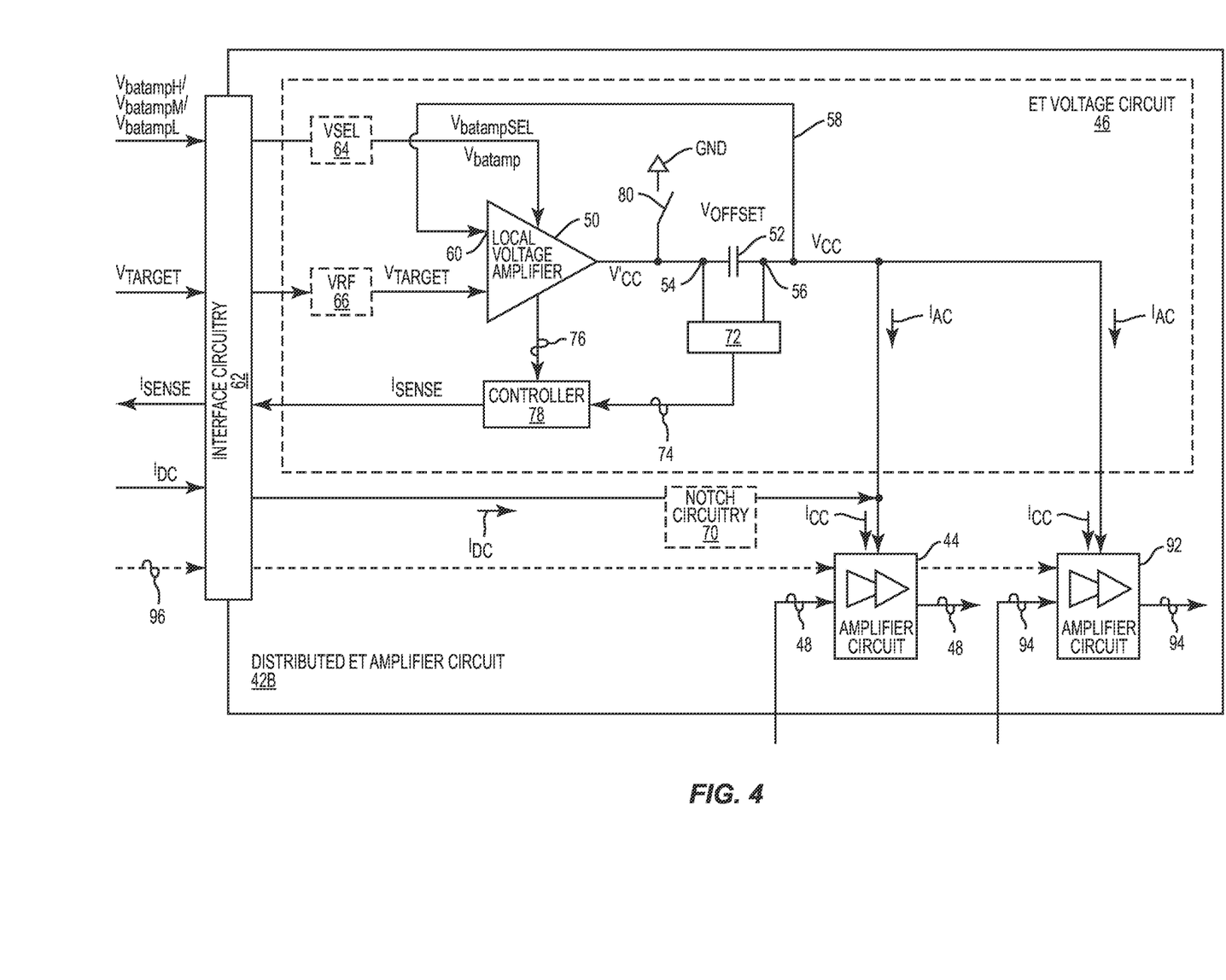
FIG. 4 is a schematic diagram of an exemplary distributed ET amplifier circuit configured according to another embodiment of the present disclosure to support more than one amplifier circuit.

The ET voltage circuit 46 of FIG. 2 and the ET voltage circuit 46A of FIG. 3 can be configured to support more than one amplifier circuit. In this regard, FIG. 4 is a schematic diagram of an exemplary distributed ET amplifier circuit 42B configured according to another embodiment of the present disclosure to support a second amplifier circuit 92 in addition to the amplifier circuit 44 of FIG. 2. Common elements between FIGS. 2 and 4 are shown therein with common element numbers and will not be re-described herein.

The second amplifier circuit 92 is configured to amplify a second RF signal 94 based on the modulated voltage $V_{CC}$. In this regard, the ET voltage circuit 46 is configured to provide the modulated voltage $V_{CC}$ to the amplifier circuit 44 and/or the second amplifier circuit 92.

In one non-limiting example, the RF signal 48 and the second RF signal 94 are identical RF signals, which may be radiated from antennas (not shown) coupled to the amplifier circuit 44 and the second amplifier circuit 92 in different polarizations (e.g., horizontal and vertical polarizations). In this regard, the amplifier circuit 44 and the second amplifier circuit 92 may amplify the RF signal 48 and the second RF signal 94 concurrently based on the modulated voltage $V_{CC}$ and the current $I_{CC}$. The distributed ET amplifier circuit 42B may receive a control signal 96 via the interface circuitry 62. The control signal 96, which may be provided by a transceiver circuit (not shown), can be configured to activate the amplifier circuit 44 and the second amplifier circuit 92 for amplifying the RF signal 48 and the second RF signal 94 concurrently.

In another non-limiting example, the RF signal 48 and the second RF signal 94 are different RF signals. For example, the RF signal 48 and the second RF signal 94 may be modulated according to different wireless communication standards and/or in different RF bands. In this regard, only one of the amplifier circuit 44 and the second amplifier circuit 92 may be activated at a given time. Accordingly, the control signal 96 may be further configured to selectively activate the amplifier circuit 44 or the second amplifier circuit 92 for amplifying the RF signal 48 or the second RF signal 94.

Figure 5:
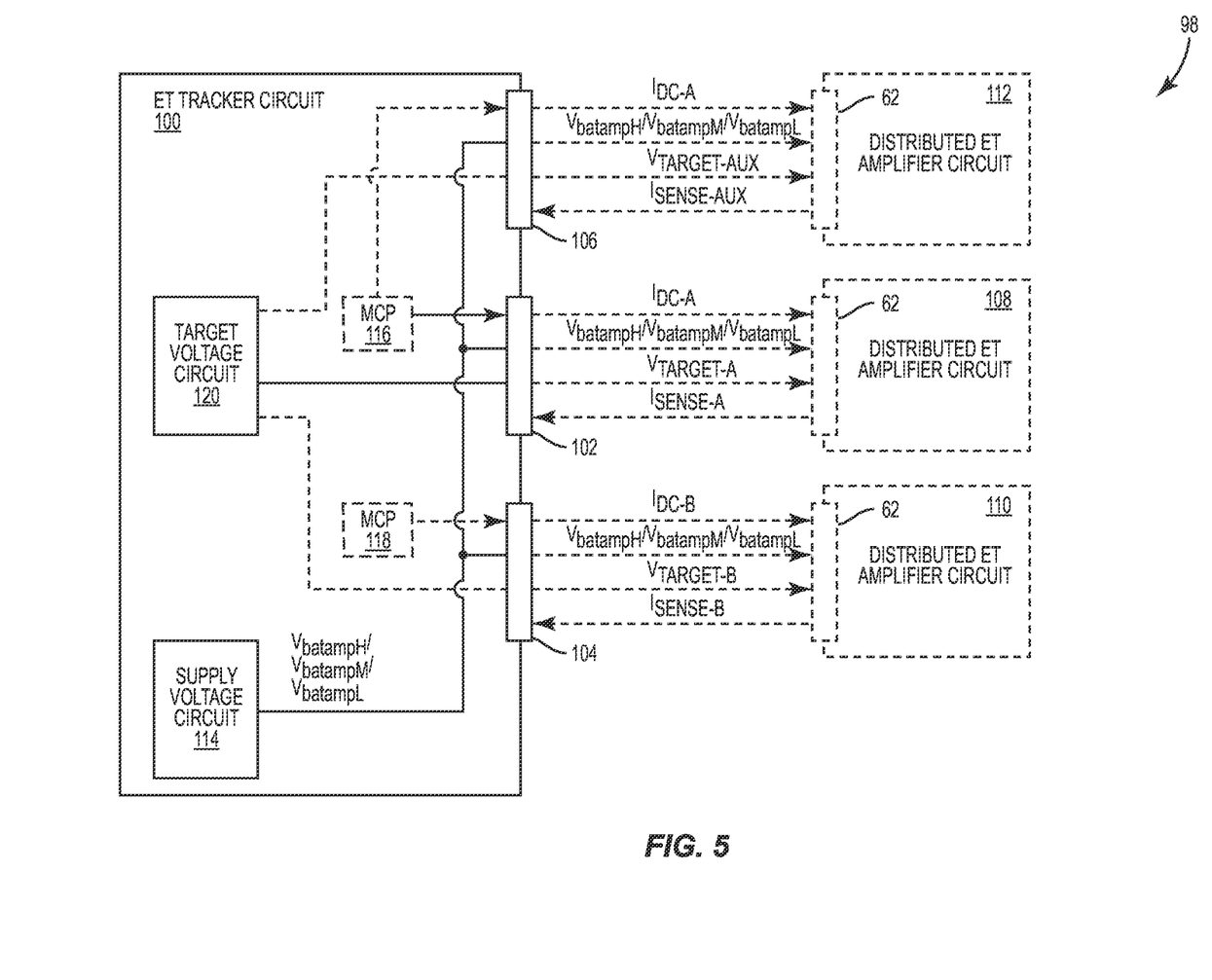
FIG. 5 is a schematic diagram of an exemplary ET amplifier apparatus configured to incorporate one or more of the distributed ET amplifier circuits of FIGS. 2-4.

The distributed ET amplifier circuit 42 of FIG. 2, the distributed ET amplifier circuit 42A of FIG. 3, and/or the distributed ET amplifier circuit 42B of FIG. 4 may be incorporated into an ET amplifier apparatus. In this regard, FIG. 5 is a schematic diagram of an exemplary ET amplifier apparatus 98 configured to incorporate one or more of the distributed ET amplifier circuit 42 of FIG. 2, the distributed ET amplifier circuit 42A of FIG. 3, and/or the distributed ET amplifier circuit 42B of FIG. 4. Common elements between FIGS. 2, 3, 4, and 5 are shown therein with common element numbers and will not be re-described herein.

The ET amplifier apparatus 98 includes an ET tracker circuit 100. The ET tracker circuit 100 may include a first interface 102, a second interface 104, and an auxiliary interface 106. The ET amplifier apparatus 98 includes a distributed ET amplifier circuit 108, which is functionally equivalent to the distributed ET amplifier circuit 42 of FIG. 2, the distributed ET amplifier circuit 42A of FIG. 3, or the distributed ET amplifier circuit 42B of FIG. 4. The distributed ET amplifier circuit 108 may be coupled to the first interface 102. In this regard, the ET tracker circuit 100 can be configured to provide an ET target voltage $V_{TARGET-A}$, a direct current $I_{DC-A}$, and the supply voltages $V_{batampH}$, $V_{batampM}$, and $V_{batampL}$ to the distributed ET amplifier circuit 108 via the first interface 102. Notably, the first interface 102 is coupled to the interface circuitry 62 over a longer conductive trace, which may correspond to a trace inductance of more than 0.4 nH.

The ET amplifier apparatus 98 may include a second distributed ET amplifier circuit 110, which is functionally equivalent to the distributed ET amplifier circuit 42 of FIG. 2, the distributed ET amplifier circuit 42A of FIG. 3, or the distributed ET amplifier circuit 42B of FIG. 4. The second distributed ET amplifier circuit 110 may be coupled to the second interface 104. In this regard, the ET tracker circuit 100 can be configured to provide a second ET target voltage $V_{TARGET-B}$, a second direct current $I_{DC-B}$, and the supply voltages $V_{batampH}$, $V_{batampM}$, and $V_{batampL}$ to the second distributed ET amplifier circuit 110 via the second interface 104.

The ET amplifier apparatus 98 may include a third distributed ET amplifier circuit 112, which is functionally equivalent to the distributed ET amplifier circuit 42 of FIG. 2, the distributed ET amplifier circuit 42A of FIG. 3, or the distributed ET amplifier circuit 42B of FIG. 4. The third distributed ET amplifier circuit 112 may be coupled to the auxiliary interface 106. In this regard, the ET tracker circuit 100 can be configured to provide a third ET target voltage $V_{TARGET-AUX}$ and the supply voltages $V_{batampH}$, $V_{batampM}$, and $V_{batampL}$ to the second distributed ET amplifier circuit 110 via the auxiliary interface 106. The third distributed ET amplifier circuit 112 may provide a sense current $I_{SENSE-AUX}$ to the ET tracker circuit 100.

The ET tracker circuit 100 may include a supply voltage circuit 114 coupled to the first interface 102, the second interface 104, and the auxiliary interface 106. In a non-limiting example, the supply voltage circuit 114 may be configured to generate the supply voltages $V_{batampH}$, $V_{batampM}$, and $V_{batampL}$. The supply voltage circuit 114 may be configured to selectively provide one or more of the supply voltages $V_{batampH}$, $V_{batampM}$, and $V_{batampL}$ to each of the first interface 102, the second interface 104, and the auxiliary interface 106. In this regard, the first interface 102, the second interface 104, and the auxiliary interface 106 may receive identical or different supply voltages.

The ET tracker circuit 100 may include a multi-level charge pump (MCP) 116 coupled to the first interface 102 and the auxiliary interface 106. The MCP 116 may be configured to generate the direct current $I_{DC-A}$ and provide the direct current $I_{DC-A}$ to the distributed ET amplifier circuit 108 via the first interface 102. The MCP 116 may also provide the direct current $I_{DC-A}$ to the third distributed ET amplifier circuit 112 via the auxiliary interface 106. The ET tracker circuit 100 may include a second MCP 118 coupled to the second interface 104. The second MCP 118 may be configured to generate the second direct current $I_{DC-B}$ and provide the second direct current $I_{DC-B}$ to the second distributed ET amplifier circuit 110 via the second interface 104.

Figure 6:
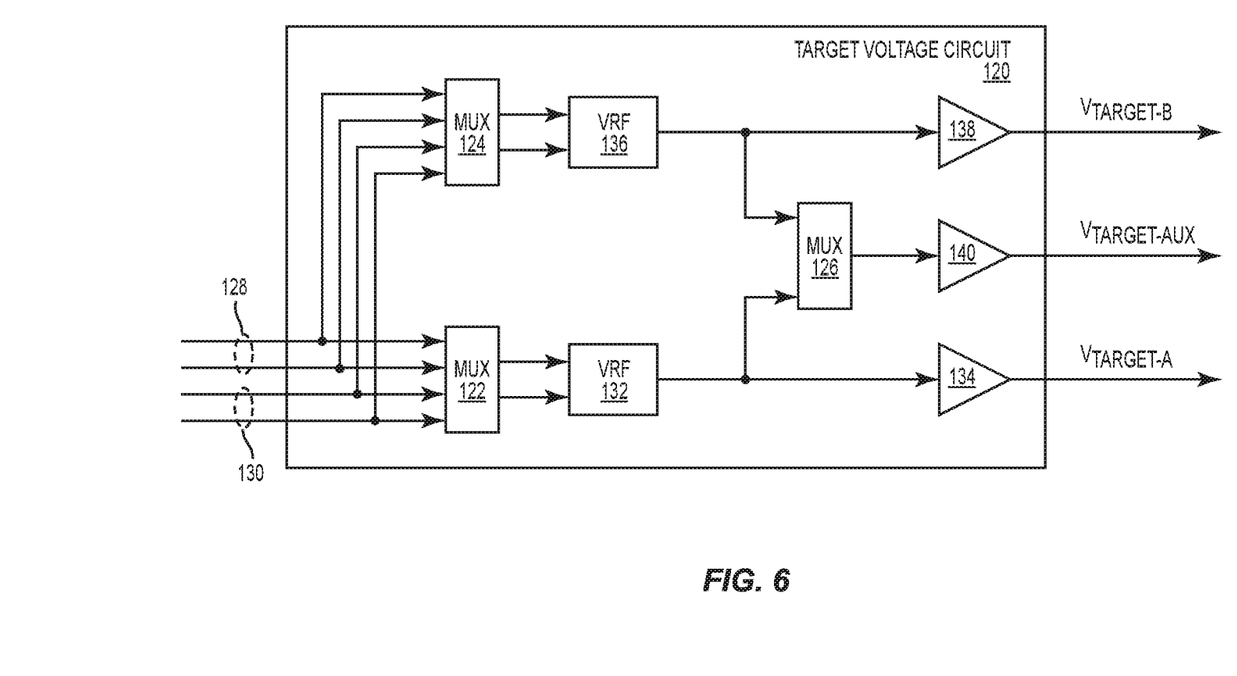
FIG. 6 is a schematic diagram of a target voltage circuit configured according to an embodiment of the present closure to generate one or more ET target voltages for the distributed ET amplifier circuits in FIG. 5.

The ET tracker circuit 100 may include a target voltage circuit 120 coupled to the first interface 102, the second interface 104, and the auxiliary interface 106. The target voltage circuit 120 is configured to generate the ET target voltage $V_{TARGET-A}$, the second ET target voltage $V_{TARGET-B}$, and the third ET target voltage $V_{TARGET-AUX}$. In this regard, FIG. 6 is a schematic diagram providing an exemplary illustration of the target voltage circuit 120 of FIG. 5 configured according to an embodiment of the present closure. Common elements between FIGS. 5 and 6 are shown therein with common element numbers and will not be re-described herein.

The target voltage circuit 120 includes a first multiplexer 122, a second multiplexer 124, and a third multiplexer 126. The first multiplexer 122 receives a first signal 128 corresponding to the ET target voltage $V_{TARGET-A}$ and a second signal 130 corresponding to the second target voltage $V_{TARGET-B}$. In a non-limiting example, the first signal 128 and the second signal 130 can each be a differential signal. The first multiplexer 122 is configured to selectively output the ET target voltage $V_{TARGET-A}$ associated with the first signal 128. The first multiplexer 122 is coupled to a first target voltage processing circuit 132 (denoted as "VRF"). The first target voltage processing circuit 132 pre-processes the ET target voltage $V_{TARGET-A}$ based on a respective transfer function and provides the ET target voltage $V_{TARGET-A}$ to a first driver 134.

The second multiplexer 124 is configured to selectively output the second ET target voltage $V_{TARGET-B}$ associated with the second signal 130. The second multiplexer 124 is coupled to a second target voltage processing circuit 136 (denoted as "VRF"). The second target voltage processing circuit 136 pre-processes the second ET target voltage $V_{TARGET-B}$ based on a respective transfer function and provides the second ET target voltage $V_{TARGET-B}$ to a second driver 138.

The third multiplexer 126 is configured to receive the ET modulated voltage $V_{TARGET-A}$ and the second ET modulated voltage $V_{TARGET-B}$. The third multiplexer 126 may be configured to selectively output the ET target voltage $V_{TARGET-A}$ or the second ET target voltage $V_{TARGET-B}$ as the third ET target voltage $V_{TARGET-AUX}$. The third multiplexer 126 is configured to provide the third ET target voltage $V_{TARGET-AUX}$ to a third driver 140.

Those skilled in the art will recognize improvements and modifications to the embodiments of the present disclosure. All such improvements and modifications are considered within the scope of the concepts disclosed herein and the claims that follow.

What is claimed is:

1. A distributed envelope tracking (ET) amplifier circuit comprising:
    interface circuitry configured to receive an ET target voltage and one or more supply voltages;
    an ET voltage circuit coupled to the interface circuitry and comprising:
        a local voltage amplifier configured to generate an initial modulated voltage based on the ET target voltage and a selected supply voltage among the one or more supply voltages; and
        an offset capacitor coupled to the local voltage amplifier and configured to raise the initial modulated voltage by a predetermined offset voltage to generate a modulated voltage; and
    an amplifier circuit configured to amplify a radio frequency (RF) signal based on the modulated voltage.

2. The distributed ET amplifier circuit of claim 1, wherein the one or more supply voltages comprise a high supply voltage, a medium supply voltage lower than the high supply voltage, and a low supply voltage lower than the medium supply voltage.

3. The distributed ET amplifier circuit of claim 1, wherein the ET voltage circuit is separated from the amplifier circuit by a conductive length having a trace inductance less than four-tenths (0.4) nanoHenry (nH).

4. The distributed ET amplifier circuit of claim 1, further comprising:
    a first semiconductor die comprising the ET voltage circuit; and
    a second semiconductor die comprising the amplifier circuit.

5. The distributed ET amplifier circuit of claim 1, wherein the ET voltage circuit further comprises a voltage selector configured to determine the selected supply voltage among the one or more supply voltages and provide the selected supply voltage to the local voltage amplifier.

6. The distributed ET amplifier circuit of claim 1, wherein the ET voltage circuit further comprises a target voltage processing circuit coupled between the interface circuitry and the local voltage amplifier and configured to pre-process the ET target voltage based on a defined transfer function.

7. The distributed ET amplifier circuit of claim 1, wherein the ET voltage circuit further comprises:
    a voltage selector configured to determine the selected supply voltage among the one or more supply voltages and provide the selected supply voltage to the local voltage amplifier; and
    a target voltage processing circuit coupled between the interface circuitry and the local voltage amplifier and configured to pre-process the ET target voltage based on a defined transfer function.

8. The distributed ET amplifier circuit of claim 1, wherein:
    the amplifier circuit is further configured to amplify the RF signal based on a direct current and an alternating current; and
    the interface circuitry is further configured to receive and provide the direct current to the amplifier circuit.

9. The distributed ET amplifier circuit of claim 8, wherein the local voltage amplifier is further configured to:
    source or sink the alternating current;
    generate and provide a sense current indicative of the alternating current sourced or sunk by the local voltage amplifier; and
    provide the sense current to the interface circuitry.

10. The distributed ET amplifier circuit of claim 9, wherein the ET voltage circuit further comprises notch circuitry coupled between the interface circuitry and the amplifier circuit.

11. The distributed ET amplifier circuit of claim 1, wherein the ET voltage circuit further comprises bias circuitry configured to generate and provide a bias voltage to the amplifier circuit.

12. The distributed ET amplifier circuit of claim 1, wherein the ET voltage circuit further comprises:
    a bias voltage selector coupled to the interface circuitry and configured to determine a selected bias voltage among the one or more supply voltages; and
    a low-dropout (LDO) regulator configured to receive the selected bias voltage from the bias voltage selector and provide the selected bias voltage to the amplifier circuit.

13. The distributed ET amplifier circuit of claim 1, wherein the ET voltage circuit further comprises:
    bias circuitry configured to generate and provide a bias voltage to the amplifier circuit;
    a bias voltage selector coupled to the interface circuitry and configured to determine a selected bias voltage among the one or more supply voltages; and
    a low-dropout (LDO) regulator configured to receive the selected bias voltage from the bias voltage selector and provide the selected bias voltage to the amplifier circuit.

14. The distributed ET amplifier circuit of claim 1, further comprising a second amplifier circuit configured to amplify a second RF signal based on the modulated voltage.

15. The distributed ET amplifier circuit of claim 14, wherein the interface circuitry is further configured to receive a control signal configured to activate one of the amplifier circuit and the second amplifier circuit in response to the RF signal being different from the second RF signal.

16. The distributed ET amplifier circuit of claim 14, wherein the interface circuitry is further configured to receive a control signal configured to activate the amplifier circuit and the second amplifier circuit in response to the RF signal being identical to the second RF signal.

17. The distributed ET amplifier circuit of claim 1, wherein the ET voltage circuit comprises:

a voltage selector configured to determine the selected supply voltage among the one or more supply voltages and provide the selected supply voltage to the local voltage amplifier;

a target voltage processing circuit coupled between the interface circuitry and the local voltage amplifier and configured to pre-process the ET target voltage based on a defined transfer function;

notch circuitry coupled between the interface circuitry and the amplifier circuit;

bias circuitry configured to generate and provide a bias voltage to the amplifier circuit;

a bias voltage selector coupled to the interface circuitry and configured to determine a selected bias voltage among the one or more supply voltages; and a low-dropout (LDO) regulator configured to receive the selected bias voltage from the bias voltage selector and provide the selected bias voltage to the amplifier circuit.

18. The distributed ET amplifier circuit of claim 1, configured to be coupled to a tracker circuit configured to provide the ET target voltage and the one or more supply voltages to the distributed ET amplifier circuit.

19. The distributed ET amplifier circuit of claim 18, wherein the distributed ET amplifier circuit is coupled to the tracker circuit by a conductive trace having more than four-tenths (0.4) nanoHenry (nH) trace inductance.

* * * * *

UNITED STATES PATENT AND TRADEMARK OFFICE
CERTIFICATE OF CORRECTION

PATENT NO. : 11,057,012 B2  
APPLICATION NO. : 16/267740  
DATED : July 6, 2021  
INVENTOR(S) : Nadim Khlat Page 1 of 1

It is certified that error appears in the above-identified patent and that said Letters Patent is hereby corrected as shown below:

In the Specification

Column 4, Line 56, replace "(e.g., 80 MHz)" with --(e.g., $\leq$80 MHz)--.

Signed and Sealed this  
Thirty-first Day of August, 2021

Drew Hirshfeld  
*Performing the Functions and Duties of the*  
*Under Secretary of Commerce for Intellectual Property and*  
*Director of the United States Patent and Trademark Office*